(12) United States Patent
Purohit et al.

(10) Patent No.: US 7,751,172 B2
(45) Date of Patent: Jul. 6, 2010

(54) SLIDING WAFER RELEASE GRIPPER/WAFER PEELING GRIPPER

(75) Inventors: Ashwin M. Purohit, Gloucester, MA (US); Dale Stone, Lynnfield, MA (US); Dave Broyer, Kingston, NH (US); Steve Drummond, Merrimac, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 711 days.

(21) Appl. No.: 11/582,814

(22) Filed: Oct. 18, 2006

(65) Prior Publication Data

US 2008/0100983 A1    May 1, 2008

(51) Int. Cl.
*H01L 21/683* (2006.01)
(52) U.S. Cl. .................... 361/234; 414/941
(58) Field of Classification Search .......... 414/941; 361/234
See application file for complete search history.

(56) References Cited

U.S. PATENT DOCUMENTS

| | | | |
|---|---|---|---|
| 5,677,824 A * | 10/1997 | Harashima et al. .......... 361/234 |
| 5,700,046 A | 12/1997 | Van Doren et al. |
| 6,236,555 B1 * | 5/2001 | Leeser ................ 361/234 |
| 6,357,996 B2 * | 3/2002 | Bacchi et al. ............ 414/754 |
| 6,762,066 B2 * | 7/2004 | Holz ................ 438/4 |
| 6,964,276 B2 | 11/2005 | Shulman et al. |
| 7,311,784 B2 * | 12/2007 | Fink ................ 118/728 |
| 2006/0192400 A1 | 8/2006 | Kim et al. |

* cited by examiner

*Primary Examiner*—Stephen W Jackson
*Assistant Examiner*—Scott Bauer
(74) *Attorney, Agent, or Firm*—Eschweiler & Associates, LLC

(57) ABSTRACT

The present invention is directed to a system and a method for peeling a wafer off of an electrostatic clamp (ESC). The ESC removal system comprises a electrostatic clamp and a wafer electrically coupled and physically in contact with each other. A plurality of grippers or pins are arranged with respect to the wafer and the ESC to allow the wafer to be peeled off or removed section by section from the electrostatic clamp. The system and method allow the wafer to be removed with a much lower pull force than current systems and methods.

15 Claims, 4 Drawing Sheets

SLIDING WAFER RELEASE GRIPPER/WAFER PEELING GRIPPER

FIELD OF THE INVENTION

The present invention relates generally to semiconductor processing systems, and more specifically to system and method for removing a wafer from an electrostatic clamp, wherein the wafer is electrically coupled and physically in contact with the electrostatic clamp.

BACKGROUND OF THE INVENTION

Electrostatic clamps or chucks (ESCs) are often utilized in the semiconductor industry for clamping substrates during, for example, plasma-based and/or vacuum-based semiconductor processes such as etching, CVD, and ion implantation, etc. Capabilities of the ESCs, including non-edge exclusion and wafer temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., plasma processing), a clamping voltage is typically applied between the wafer and the electrode, wherein the wafer is clamped against the chuck surface by electrostatic forces.

A subset of electrostatic clamps, referred to as Johnsen-Rahbek (J-R) clamps, utilize "leaky" dielectric layers (e.g., semiconductive dielectric layers having bulk resistances of between approximately $1 \times 10^9$ to $1 \times 10^{12}$ Ohm-cm) in contact with the wafer, wherein greater clamping forces can be achieved at lower voltages than with conventional non-J-R clamps. Lower voltage input to the ESC typically not only reduces power supply requirements associated with the J-R clamps, but further provides a clamping environment that is potentially less destructive to the wafer and devices formed thereon.

A conventional J-R clamp, for example, comprises a dielectric layer that is slightly conductive, thus generally permitting a thickness of the dielectric layer (e.g., a ceramic) to be thicker than would be permitted for a "classic" or Coulombic ESC. Such an increase in thickness greatly facilitates the clamp manufacturing process, while also reducing clamp operating voltages. For example the dielectric layer can be used as a base for the formation of positive and negative electrodes by screen printing and firing of a dielectric paste.

However, a charge transfer typically resulting from the use of a semiconductor dielectric, for example, can also transmit a charge to the wafer, therein generating residual clamping forces that can result in a delay in releasing the wafer from the clamp. To mitigate the effects of residual clamping forces, A/C clamping voltages utilizing multiple groups of electrodes (e.g., multi-phasing or poly-phasing) can be utilized to diminish the clamping forces. However, such A/C clamping voltages and multiple groups of electrodes typically necessitate that each electrode have its area distributed somewhat evenly across the clamp. The resulting electrode structures can be quite complicated and expensive because of the design constraints driven by the need to maximize clamping area and force.

Most wafer removal mechanisms remove the entire wafer perpendicular to the electrostatic clamp surface. The forces required to remove a wafer in this manner are significantly high and can result in damage to the wafer.

In addition, there is a need for greater throughput of wafers in production, often measured in wafers per hours. Rates have recently gone from 200 wafers produced per hour with companies pushing now for 400-500 wafers/hour. Wafer and ESC electrical discharge is typically a function of time, and the times necessary to allow a wafer to discharge to allow removal due to acceptable forces, for example were suitable in the 200 wafers/second range. However those electronic discharge rates are no longer acceptable for the higher throughputs. Consequently, a need exists to improve production time of wafers or wafer throughput.

Therefore, a need exists in the art for a mechanism and/or method that reduces the force required to remove the wafer from the electrostatic clamp, wherein reliability is increased, while also reducing production costs.

SUMMARY OF THE INVENTION

The present invention overcomes the limitations of the prior art. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an electrostatic clamp (ESC) release system or wafer release system for releasing a substrate such as a semiconductor wafer from the ESC utilizing lower forces. The present invention is further directed toward a method for more reliably releasing, for example, a semiconductor wafer than is currently practiced in the art. In accordance with one exemplary aspect of the present invention, the ESC release system comprises a standard gripping mechanism that holds the wafer at, for example, three concentric, equidistant gripper locations on or near the edge of the wafer. One of the grippers can be allowed to translate perpendicular to the wafer's planar surface and relative to the other stationary gripper(s). In this manner, the wafer can be "peeled off" of the electrostatic clamp rather than being pulled off the ESC, all at one time.

According to another exemplary aspect of the present invention, a wafer-pin-lift type system can be employed by adjusting the lift mechanism to lift one side of the wafer prior to the opposing side being lifted, thus again peeling the wafer off the ESC. Such an approach to lifting the wafer can result in lower forces being utilized than is normally required in a typical release system.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
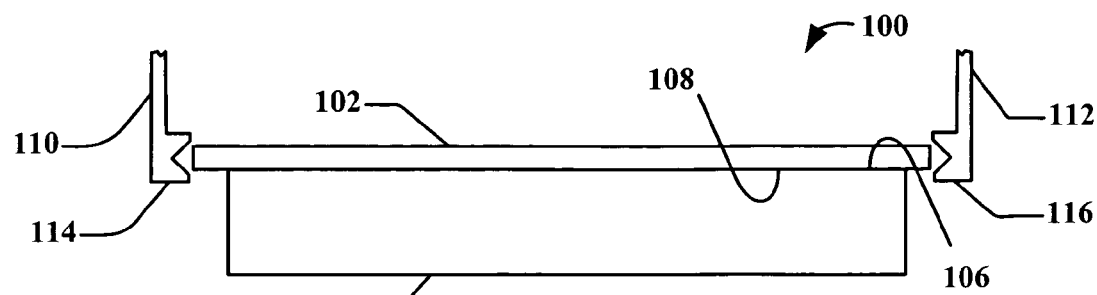
FIG. 1 is a partial cross-sectional side view of an exemplary ESC release system according to one aspect of the present invention.

The present invention is directed generally towards an electrostatic clamp release system for releasing a semiconductor substrate or wafer from an electrostatic clamp. More particularly, the invention is directed toward a potentially lower force electrostatic clamp release system and method of manufacturing same, wherein the electrostatic clamp release system is operable to provide a economical and reliable releasing force. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates a partial cross-section of an exemplary electrostatic clamp release system 100, also referred to as an "ESC release system" or a "wafer release system" 100. The ESC release system 100 is operable to release a substrate 102, such as a semiconductor wafer, thereto held by residual electrostatic forces. The ESC release system 100, for example, comprises an electrostatic clamp 104 having a clamping surface 106 associated therewith, wherein the wafer surface 108 generally resides on the ESD clamping surface 106 by the electrostatic forces during electrostatic clamping. The ESC 104 and wafer 102 can be mounted in any configuration, for example, vertically, horizontally or at any angle. The electrostatic clamp 106, for example, can be comprised of a doped ceramic substrate (e.g., alumina doped with titanium, aluminum nitride doped with cerium oxide, and the like). The ceramic layer further comprises a backside surface that is generally opposite the clamping surface 106, wherein a plurality of electrically conductive electrodes, for example, can be arranged across the backside surface of the ceramic layer. The plurality of electrodes can be, for example, arranged in a predetermined manner, wherein the plurality of electrodes are generally distributed about an interior region and a peripheral region of the backside surface, wherein each electrode in the interior region is associated with a respective one or more electrodes in the peripheral region, therein generally defining a plurality of electrode groups. The ESC 104 can be a DC or AC device and the wafer 102 can retain a charge after the ESC 104 is turned off. The residual charge in the wafer can cause the wafer 102 to be retained against the chuck/clamp 104.

The substrate can be removed from the electrostatic clamp using a standard gripping system utilizing three grippers, for example. FIG. 1 illustrates a first gripper 110, a second gripper 112 and a third gripper (not shown), for example. In this embodiment, the three grippers are in a generally planar configuration, spaced around the outer edge of the wafer 102 in what is often referred to as an edge-grip configuration. It is to be appreciated that any number of grippers, any shape grippers (e.g., ring type grippers, etc.) and any spacing between the grippers (e.g., equidistant, etc.) is envisioned in the present invention.

The first gripper 110, the second gripper 112 and the third gripper can be moved utilizing, for example, motors, linear actuators, pneumatic actuators, hydraulic actuators, electromagnetic actuators, springs, linear slides, and the like. The wafer 102 as illustrated in FIG. 1 is held by a first gripper jaws 114, a second gripper jaws 116 and a third gripper jaws (not shown) in an approximate planar condition, for example.

Figure 2:
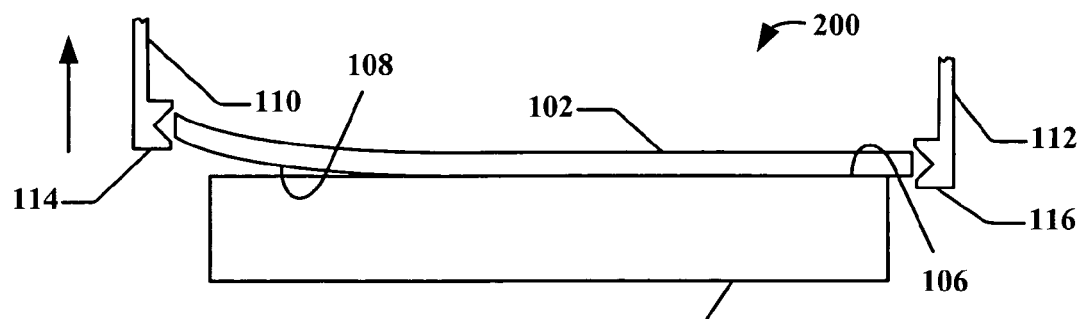
FIG. 2 is a partial cross-sectional side view of an exemplary electrostatic clamp release system arranged in a predetermined manner according to another aspect of the present invention.

According to one exemplary aspect of the present invention, FIG. 2 illustrates a partial cross-sectional side view of the exemplary ESC release system 200. The first gripper 110 is translated as shown, for example, wherein the second gripper 112 and the third gripper (not shown) are held stationary. It should be noted that the predetermined pattern of grippers in which the ESC release system is generally arranged can differ from that illustrated in the figures, and all such patterns are contemplated as falling within the scope of the present invention. As the first gripper 110 is translated perpendicular to the wafers planar surface the edge of the wafer 110 can begin to "peel off" the wafer 102 from the ESC clamping edge 106. In another embodiment, gripper 110 can be fixed to a mechanism and held stationary while the second gripper 112 and the third gripper slide to create a peeling condition of the wafer 102 away from the ESC 104.

It should be noted that the ESC 100 may comprise any number of gripper jaw configurations (e.g., pivoted jaws, curved jaws, angular gripper jaws, opposed movable jaw grippers, standard parallel gripper jaws, any combination of jaws, and the like), and all such gripper jaws are further contemplated as falling within the scope of the present invention. Likewise, in this embodiment the first gripper 110, the second gripper 112 and the third gripper or the ESC 104 can be linearly translated (e.g., simultaneously, in different direction, etc.) and/or rotated to achieve the peeling off condition, and all such movements to attain peeling off of the wafer 102 are contemplated as falling with the scope of the present invention. The peeling off of the wafer 110, as opposed to pulling the wafer straight of the ESC 104, can result in lower forces necessary to remove the wafer 102, for example and this can result in the usage of simpler, lower cost robots that provide the lower forces needed to remove the wafer 102. This can also result in more efficient wafer removal which can result in greater throughput due to the reduction in wafer 102 breakage resulting from utilizing lower forces and the shorter times in removing wafers 102.

Figure 3:
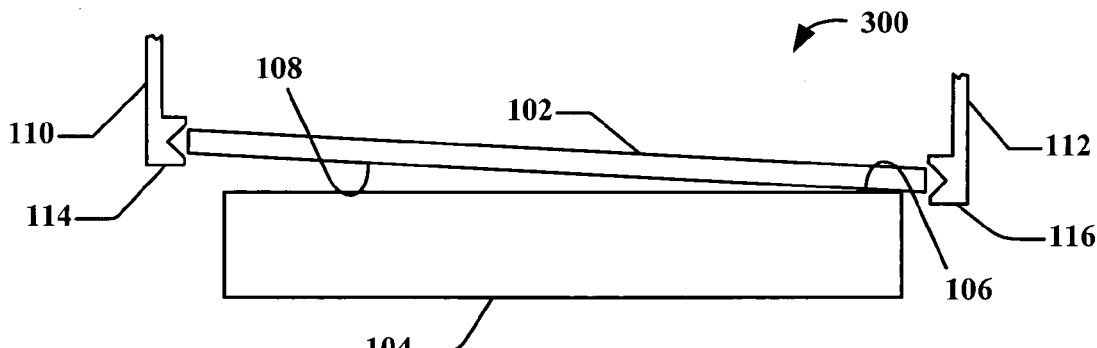
FIG. 3 is a side view of the exemplary ESC release system having gripper supports associated with the semiconductor wafer according to yet another aspect of the present invention.

The reduction in removal forces associated with the present invention, for example, can also allow greater clamping pressures and forces because the greater forces as less likely to result in damage to the wafer 102. The greater clamping forces can reduce the number of "lifting attempt cycles" necessary to remove the wafer 102 during the wafer 102 ESC unclamping operations. It should be noted that the present invention can advantageously allow for a fewer number of operations to be carried out on the wafer 102. Peel forces can be substantially less than equal gripper translational pull forces due to a narrow strip of the wafer contact area 118 being lifted initially as illustrated in FIG. 2. As peeling proceeds, the narrow strip 118 breaks away, resulting in the peel force being applied to the "next" narrow strip of contact area, as opposed to the current area that forces the entire contact area of the wafer to "break free" from the ESC. This process of breaking away small contact areas, according to the present invention, continues until the substrate is physically separated from the ESC surface 106, as illustrated in FIG. 3. The peeling force for a peeling-type gripper system can be approximately between about 0.1 and 3.0 lbs, wherein the pull force perpendicular to the wafer planar surface for the current art system, can be as large as about 3 to 30 lbs.

Referring again to FIG. 3 at 300, the wafer 102 and the wafer surface 108, in one example, is completely free of the ESC bonding surface 106. The first gripper 110 and the first gripper jaws 114 as illustrated, for example can be moved to a higher vertical position than the other grippers and gripper jaws by a linear actuator (not shown). Alternatively, the ESC 105 can be moved to a lower vertical position, or the like, wherein the ESC mounting surface 106 is completely separated from the wafer surface 108. According to one example, the ESD actuator can be translated utilizing a hydraulic actuator, a pneumatic actuator, and the like, and all such alternative actuators are contemplated as falling within the scope of the present invention. Furthermore, the plurality of grippers and the ESC can be moved in a concurrent fashion, for example to separate the wafer 102 from the ESC 104.

Figure 4:
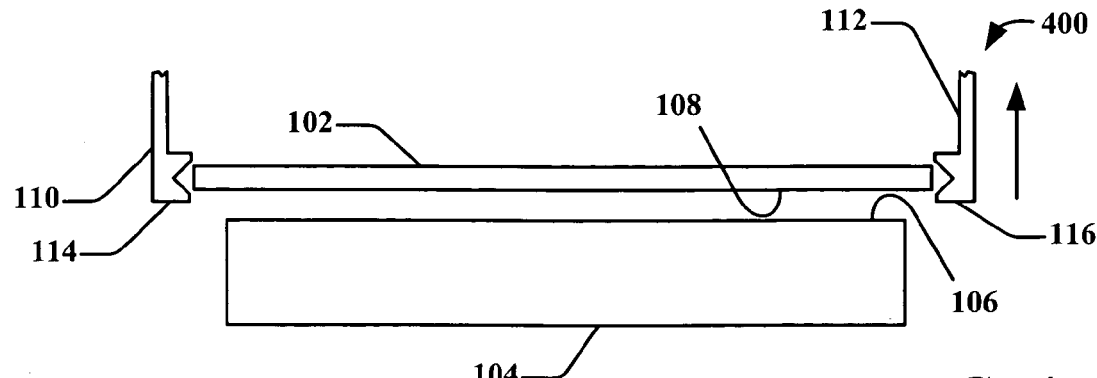
FIG. 4 is a partial cross-sectional side view of an exemplary ESC release system according to one aspect of the present invention.

Furthermore, as illustrated at 400 in FIG. 4, during the wafer 102 and ESC 104 separation process the first gripper 110, the second gripper 112, and the third gripper (not shown) can be translated, once again so that the first gripper jaws 114, the second gripper jaws 116, and the third gripper jaws (hidden from view) are approximately planar, as they were in FIG. 1, for example. Therefore, re-planarizing the wafer 102 can move it to a fixed/known position for further wafer handling operations, so that devices do not have to accommodate unusual and/or variable angles or positions of the wafer 102 after its release. The process can improve handling time since it eliminates the need for "discharging" the wafer 102 from residual clamp forces. This can be allow the wafer 102 to be pulled off the chuck 104 without waiting for the chuck 104 to be turned off, thereby eliminating any time spent waiting for these steps to happen.

Figure 5:
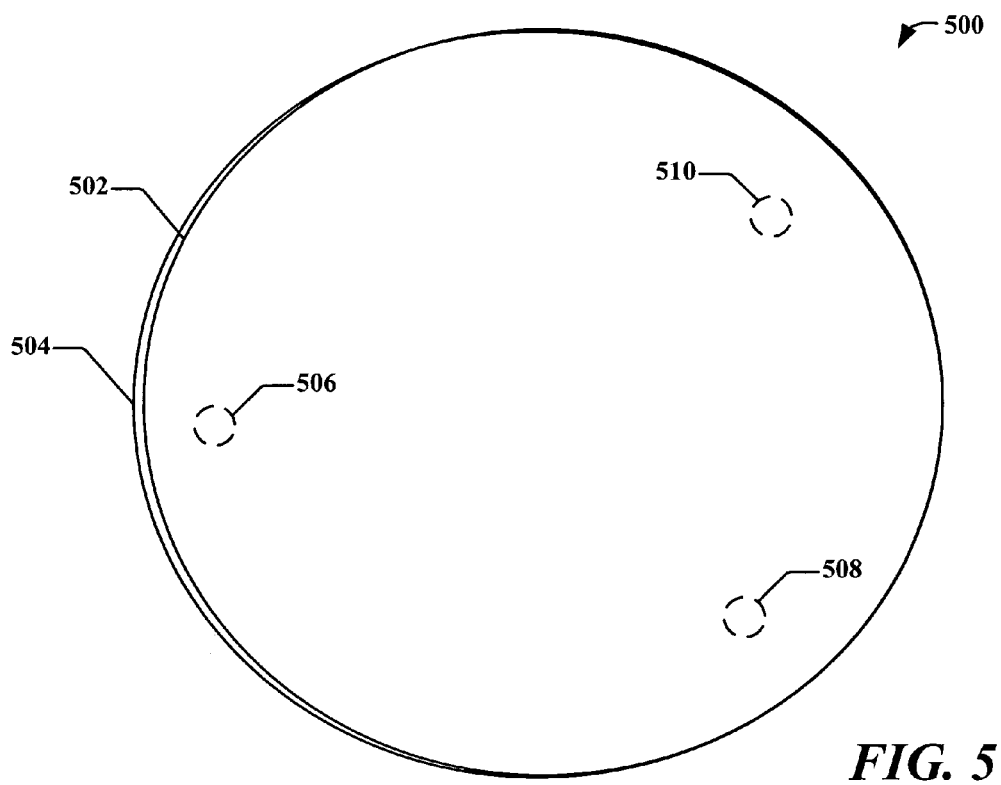
FIG. 5 is a top plan view of an exemplary wafer-lift type system that employs pins to peel off the wafer from the ESC according to one aspect of the present invention.

FIG. 5 is a top plan view of a wafer 502 held in place by wafer handling system 500, for example. The wafer 502 is captured by an electrostatic clamp 704 (of which only a small section can be seen) and the wafer 502 as shown is being "peeled" off of the ESC 704 by a first pin 706 underneath the wafer. The first pin 706 can move vertically, for example perpendicular to the plane of the wafer 502. A spring, motor, linear actuator, and the like, for example, can drive the first pin in the vertical direction. A linear actuator, for example can drive the first pin 506 to move the wafer 502, for example wherein to lift the edge of the wafer initially prior to moving the second and third pins, 508 and 510 respectively once the first pin 506 has moved a given distance. It is to be appreciated that the peeling off of the wafer can be accomplished in numerous ways known to those skilled in the art, for example, a pin spring assembly which prevents the motion of designated pins, over a specific distance, while another pin moves to peel the wafer of the ESC, a sliding spring mechanism, an air cavity, and the like.

Figure 6:
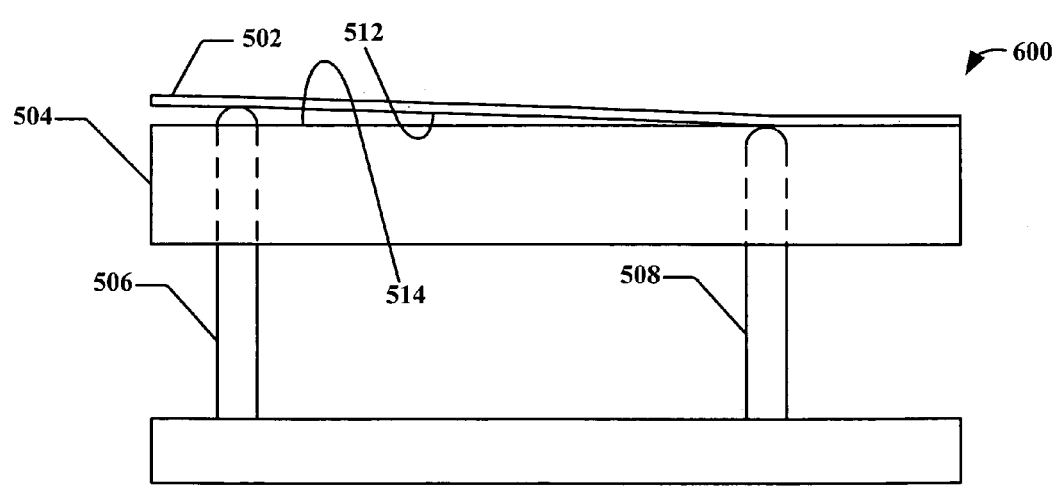
FIG. 6 is a side view of an exemplary lift system for wafers that utilizes pins according to yet another aspect of the invention.

FIG. 6 is a side view of the wafer 502 as it is being peeled away from the electrostatic clamp 504 as part of the wafer handling system 600, for example. The wafer has a lower edge 512 that is driven away from an ESC top edge 514 by a first pin 506 in the vertical direction. A second and third pin, 508 and 510 (not shown) have not translated yet in this illustration. Once the first pin 506 has translated a pre-defined distance the second pin 508, or the third pin 510 (not shown), or both can begin to move to peel the wafer 502 off of the ESC 504 completely. Alternatively, the pins 506, 508 and 510 (not shown) associated with the electrostatic clamp 504 can be substantially pointed, flat, circular at the outer surface, etc., wherein the pins 506, 508 and 510 contact the lower edge 512 of the wafer 502. Likewise, the number of pins associated with the wafer handling system 600 can be of any number, and all such shapes and numbers of pins associated with the ESC 504 and the wafer handling system 600 are contemplated as falling with the scope of the present invention.

Figure 7:
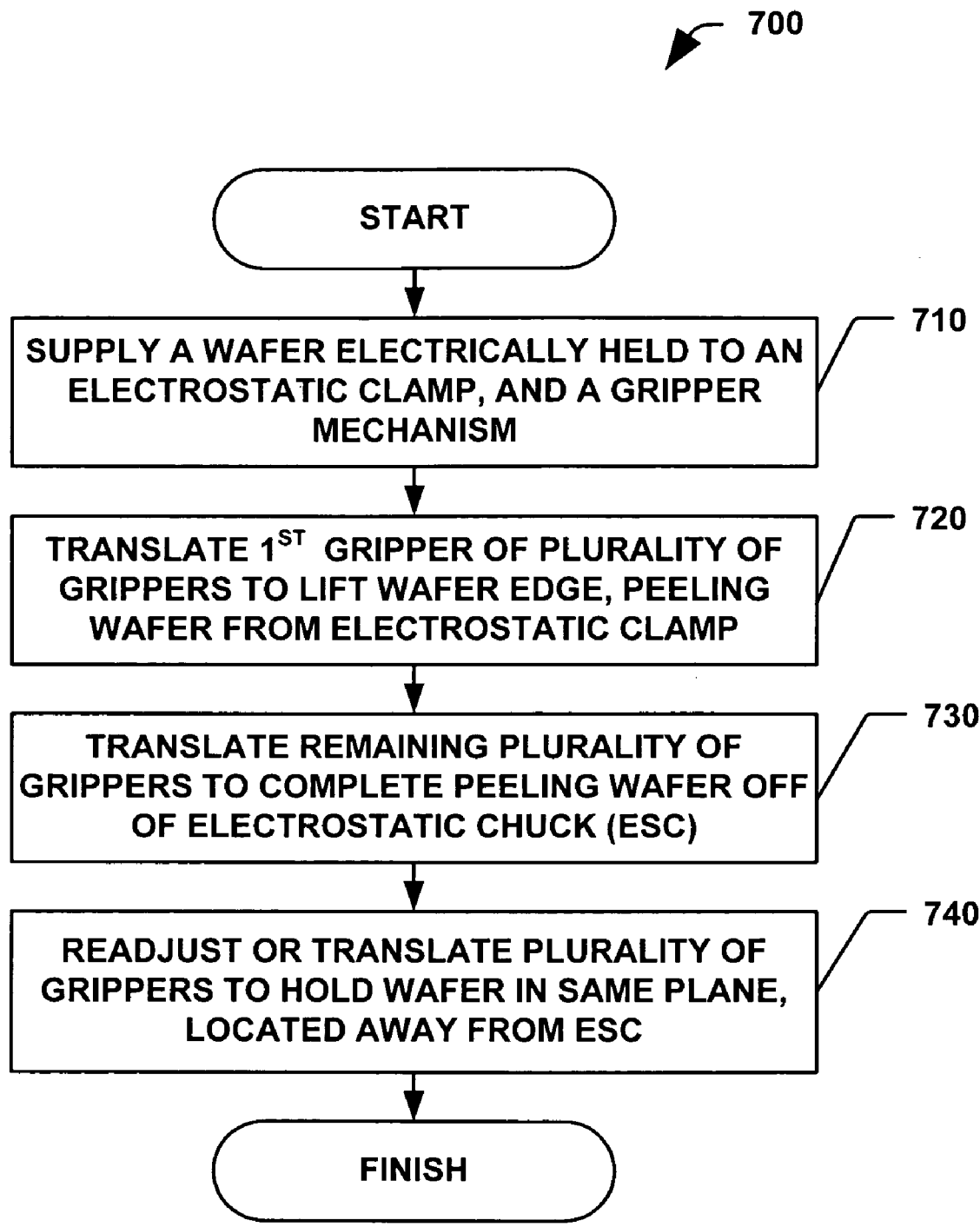
FIG. 7 is a block diagram of a method for releasing a semiconductor substrate from an electrostatic clamp utilizing grippers according to another exemplary aspect of the invention.
Figure 8:
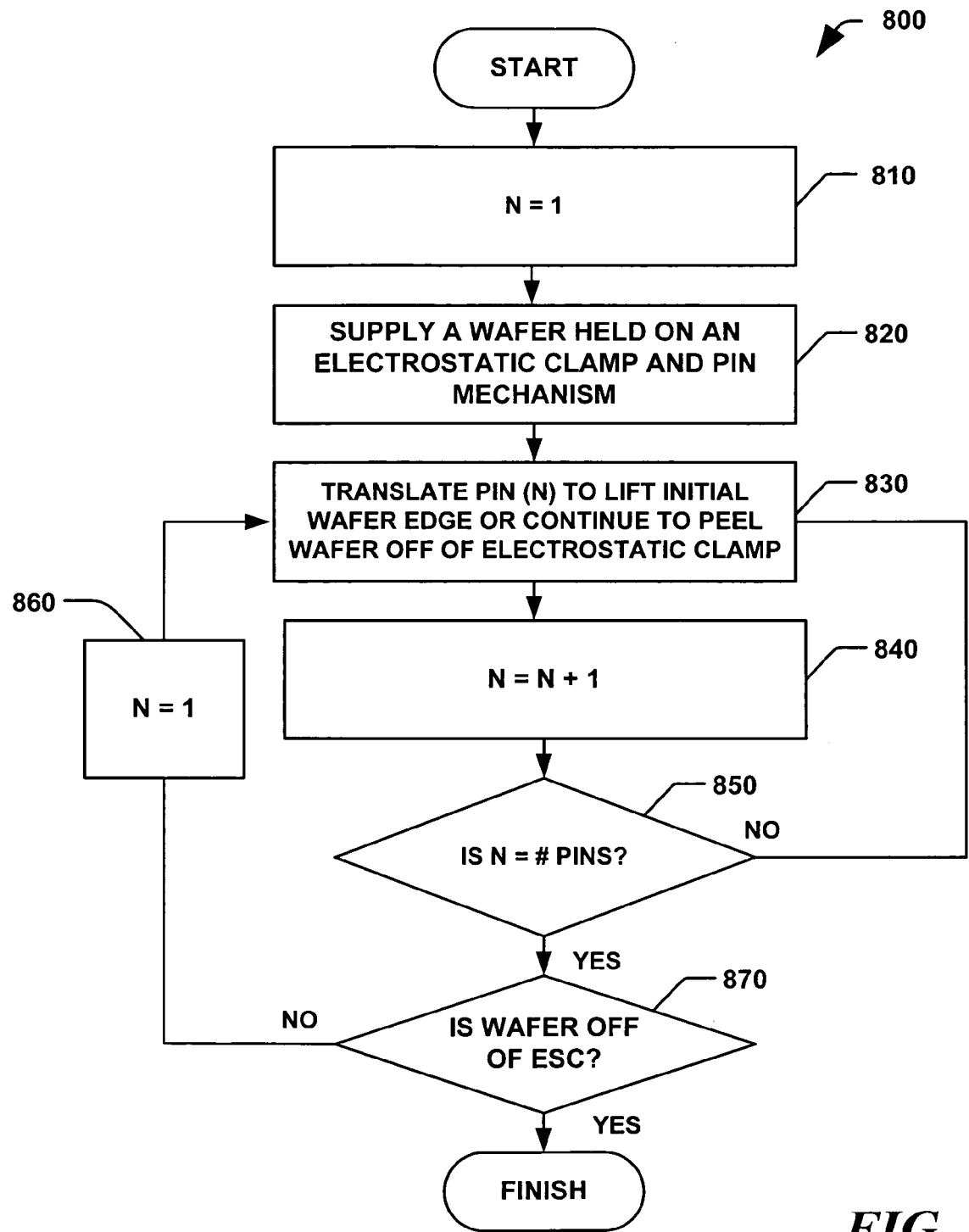
FIG. 8 is a block diagram illustrating a method for releasing a wafer from an ESC employing a pin lift-type system according to yet another exemplary aspect of the invention.

According to still another exemplary aspect of the present invention, FIG. 7 is a schematic block diagram of an exemplary method 700 illustrating a method of peeling a wafer off of an electrostatic chuck according to an exemplary wafer removal system 100, 200, 300 and 400 of FIGS. 1, 2, 3 and 4. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 7, the method 700 begins with supplying a wafer electrically coupled to an electrostatic chuck and a gripper mechanism in act 710. The electrostatic clamp, for example, comprises a ceramic material suitable for providing a clamping surface for the semiconductor wafer. The wafer can be made of a suitable material, for example, silicon and can be 300 millimeters in diameter and have a thickness of 775±20 micrometers. The gripper mechanism can be a device with three grippers, for example with "v shaped" gripper pads. In act 720, the first gripper is translated to initiate the peeling off of the wafer from the electrostatic clamp (ESC). The outermost edge of the underside of the wafer, at about the location of the first gripper, begins to separate from the ESC. At this moment in time the other grippers are stationary and have not been moved from an initial position. The set of grippers, for example, can be patterned around the outer edge of the wafer, equidistant from each other.

In act 730, a second and third grippers are translated approximately perpendicular to the planar surface of the electrostatic clamp, wherein the second and third grippers generally begin to translate and move at the same time and rate, respectively. The wafer can be generally peeled back to the imaginary line formed between the second and third grippers. Readjusting the grippers in act 740, for example, generally ensures that the wafer is in a known location for further processing. The wafer, for example, generally is held away from the ESC and is then moved on for further processing, storage, and the like.

In one alternative, the grippers can be roller grippers in act 720 that can be both translated vertically with respect to the wafer planar surface, while at the same time can be rotated about the outer edge of the wafer. The outer wafer sections or areas are lifted, and the edge is lifted around the entire circumference of the wafer. In this way the lifting of the wafer takes place from the outer surface of the wafer, proceeding toward the center of the wafer. According to another exemplary aspect of the invention, the ESC and a combination of the grippers can be translated at the same time. In another example, each gripper can be, translated, wherein the earliest gripper to lift the wafer, based on data obtained from sensors, can be the starting point for peeling back the wafer. The sensors, can be, for example, load sensors, proximity sensors, IR sensors, laser sensors, and the like.

It should be noted that thickness and diameter of the wafer, number and spatial arrangement of grippers, type of voltage applied to the ESC (AC or DC), gripper shape, rate of the wafer peeling, and the like can changed, and such variations are contemplated as falling within the scope of the present invention. Furthermore, such changes of the aforementioned acts can advantageously provide for greater throughput of the various wafers.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrostatic clamp release system for releasing a workpiece, the electrostatic clamp release system comprising:
   an electrostatic clamp having a first surface configured to support a first surface of a workpiece thereon;
   a gripper system having a plurality of grippers with gripper jaws,
      wherein the plurality of grippers are arranged around the electrostatic clamp at predetermined locations thereof;
      wherein the gripper jaws are configured to engage an outer edge of the workpiece when residing on the first surface of the electrostatic clamp, and
      wherein one or more, but not all of the plurality of grippers are configured to translate in a predetermined manner concurrently to cause a portion of the first surface of the workpiece to peel away from the first surface of the electrostatic clamp when a workpiece resides on the electrostatic clamp.

2. The electrostatic clamp release system of claim 1, wherein the gripper shapes comprise at least one of the following: v-shape, circular, tapered "teardrop" shape, round, square, rectangular, triangular, blade edge, and U shaped.

3. The electrostatic clamp release system of claim 1, wherein the plurality of grippers comprise three wafer grippers arranged about an outer edge of the electrostatic clamp.

4. The electrostatic clamp release system of claim 3, wherein the three wafer grippers are arranged at approximately 120 degrees apart around the outer edge of the electrostatic clamp.

5. The electrostatic clamp release system of claim 1, wherein one or more sensors are coupled to the plurality of grippers.

6. The electrostatic clamp release system of claim 1, wherein the grippers are configured to be translated in a direction non-parallel to a plane defined by a surface of the workpiece when residing on the electrostatic clamp.

7. A method for peeling a workpiece off an electrostatic clamp, the method comprising:
   supplying the workpiece to the electrostatic clamp having a gripper mechanism comprising a plurality of grippers associated therewith;
   translating solely a first gripper of the plurality of grippers to initiate peeling the workpiece off of the electrostatic clamp; and
   translating a remaining portion of the plurality of grippers individually in a defined sequence to completely peel the workpiece off of the electrostatic clamp.

8. The method of claim 7, wherein peeling the workpiece off the electrostatic clamp further comprises:
   applying at least 0.1 pounds of force initially to any one gripper of the plurality of grippers.

9. The method of claim 7, wherein peeling the workpiece off the electrostatic clamp further comprises:
   utilizing at least one grounding pin to assist electronically discharging the wafer.

10. The method of claim 7, wherein peeling the workpiece off of the electrostatic clamp further comprises:
    utilizing an AC field for the electrostatic clamp.

11. The method of claim 7, wherein peeling the workpiece off of the electrostatic clamp further comprises:
    utilizing a DC field for the electrostatic clamp.

12. The method of claim 10, wherein peeling the workpiece off of the electrostatic clamp further comprises: applying an AC voltage of ±1000 volts and a frequency of about 0.1 Hz to about 20 Hz to the electrostatic clamp.

13. The method of claim 10, wherein peeling the workpiece off of the electrostatic clamp further comprises:
    applying a DC voltage of ±1000 volts to the electrostatic clamp.

14. A method for peeling a workpiece off an electrostatic clamp, the method comprising:
    supplying the workpiece held on the electrostatic clamp and a gripper mechanism comprising a plurality of grippers;
    translating one or more, but not all of the plurality of grippers concurrently to initiate peeling the workpiece off of the electrostatic clamp; and
    translating a remaining portion of the plurality of grippers individually in a defined sequence to completely peel the workpiece off of the electrostatic clamp.

15. The method of claim 14, wherein the translating of the grippers is performed in a direction non-parallel to a plane defined by a surface of the workpiece when residing on the electrostatic clamp.

* * * * *